United States Patent

Miller et al.

[11] Patent Number: 6,150,614
[45] Date of Patent: Nov. 21, 2000

[54] CONDUCTING FOIL FOR CONDUCTIVELY CONNECTING ELECTRIC AND/OR ELECTRONIC COMPONENTS

[75] Inventors: Bernhard Miller, Stuttgart; Friedbert Roether, Cleebronn; Norbert Schneider, Tiefenbronn, all of Germany

[73] Assignee: Robert Bosch GmbH, Stuttgart, Germany

[21] Appl. No.: 09/125,183

[22] PCT Filed: Sep. 9, 1997

[86] PCT No.: PCT/DE97/01995

§ 371 Date: Aug. 12, 1998

§ 102(e) Date: Aug. 12, 1998

[87] PCT Pub. No.: WO98/28956

PCT Pub. Date: Jul. 2, 1998

[30] Foreign Application Priority Data

Dec. 20, 1996 [DE] Germany ............... 196 53 360

[51] Int. Cl.⁷ ...................................................... H05K 1/00
[52] U.S. Cl. ........................................ 174/254; 361/749
[58] Field of Search ................................ 361/749, 750, 361/751; 174/250, 254, 255

[56] References Cited

U.S. PATENT DOCUMENTS

| H416 | 1/1988 | Colvin | 361/398 |
|---|---|---|---|
| 4,127,740 | 11/1978 | LaMarche | 174/68.5 |
| 4,937,707 | 6/1990 | McBride et al. | 361/398 |
| 5,296,831 | 3/1994 | Suzuki | 336/200 |
| 5,384,690 | 1/1995 | Davis et al. | 361/789 |
| 5,495,076 | 2/1996 | Davis | 174/254 |
| 5,585,157 | 12/1996 | Taguchi | 428/63 |
| 5,723,205 | 3/1998 | Millette et al. | 428/209 |
| 5,737,053 | 4/1998 | Yomogihara et al. | 349/149 |
| 5,742,480 | 4/1998 | Sawada et al. | 361/749 |
| 5,764,497 | 6/1998 | Mizumo | 361/803 |
| 5,777,855 | 7/1998 | Yokajty | 361/803 |

FOREIGN PATENT DOCUMENTS 0 635995  1/1995  European Pat. Off. .

OTHER PUBLICATIONS

Copy of reference not enclosed—originally forwarded with Search Report by International Searching Authority C.D. Keirstead, "Flexible Printed Circuits: A Design Primer", Assembly Engineering, Bd. 31, No. 5, 1988, pp. 32–36.
Copy of reference not enclosed—originally forwarded with Search Report by International Searching Authority Patent Abstracts of Japan, vol. 15, No. 290 (M–1139), Jul. 23, 1991 & JP 03 104755, May 1, 1991.

*Primary Examiner*—Jeffrey Gaffin
*Assistant Examiner*—Jeremy Norris
*Attorney, Agent, or Firm*—Kenyon & Kenyon

[57] ABSTRACT

In a conductor foil for conductively connecting electrical and/or electronic components, the conductor foil including printed circuit traces, insulated to the outside and applied on a non-conductive, elastically malleable carrier foil. The conductive foil also includes soldering surfaces connected to the printed circuit traces, for soldering to electric terminals of components, in addition, the conductor foil includes feed line segments through which the printed circuit traces are led to the soldering surfaces, in order, in response to shaking stresses, to avoid damage to the soldering points by vibrations transmitted by the feed line segments. Furthermore, the conductor foil has stiffening segments branching off from the feed line segments, the stiffening segments, in response to shaking stresses, causing a force diversion of the vibrations onto the stiffening segments via the feed line segment movable end, which is not connected to the soldering surfaces.

9 Claims, 1 Drawing Sheet

CONDUCTING FOIL FOR CONDUCTIVELY CONNECTING ELECTRIC AND/OR ELECTRONIC COMPONENTS

FIELD OF THE INVENTION

The present invention relates to a conductor foil for conductively connecting electrical and/or electronic components.

BACKGROUND INFORMATION

It is known to use conductor foils for electrically connecting electrical or electronic components. The conductor foils have a multilayer structure, printed circuit trace patternings, insulated to the outside, being applied to a nonconductive carrier foil. For example, it is known to apply thin copper printed circuit traces onto a carrier foil made of polyimide and to cover them with a further carrier foil. The printed circuit traces are conductively connected to the soldering surfaces arranged on the conductor foil for hard-soldering to the electrical terminals of components. Conductor foils of this type are employed, for example, near automobile engines or transmission units. Thus it is known, for example, to integrate a hybrid circuit in the housing of a clutch actuator, the hybrid circuit being connected, via a conductor foil, to various valves for regulating compressed air as well as to an eddy current sensor and to a plug-in part for connection to external cables. The hybrid circuit has a plug connector for this purpose, whose connector pins are soldered to the soldering surfaces of the conductor foil, which are designed as soldering eyelets. The elastically malleable conductor foils have great strength in the face of vibration stresses, but the most extreme shaking stresses arising in units of this type with acceleration up to 50 g, exert extremely heavy stresses on the soldering surfaces of the conductor foil. Vibration stresses, which are transmitted to the plug connector via a vibrating feed line segment of the conductor foil, can lead to the soldering points breaking or individual connecting pins being broken from the plug connector.

SUMMARY OF THE INVENTION

The conductor foil of the present invention has an advantage that the forces exerted by the vibrations of a feed line segment of the conductor foil are not transmitted to the soldering surfaces of the conductor foil, and, in this way, damage to the soldering points is avoided and the reliability of the electrical connection is increased. This is achieved by providing for at least one stiffening segment branching off from the feed line segment, the stiffening segment bringing about a diversion of the forces of vibrations transmitted to the stiffening segment, via the movable end of the feed line segment, which is not connected to the soldering surfaces.

It is particularly advantageous, as a means of force diversion, to arrange on the conductor foil at least one reinforcing layer to stiffen the elastically malleable conductor foil, the stiffening layer covering the feed line segment in the bonding area of the feed line segment and extending at least partly over the stiffening segment. The reinforcing layer can be applied to the conductor foil using conventional production methods in a simple manner.

Furthermore, it is advantageous to integrate a connecting point into the stiffening segment, the connecting point being spatially separate from the soldering points of the feed line segment and able to be connected to a connecting means. The connecting point can be affixed to a housing part, for example, using a screw or a corresponding aid. Then, in response to vibration stresses, the forces of the conductor foil feed line segment, acting upon the stiffening segment, are transmitted to the screw connected to the connecting point.

The reinforcing layer can advantageously be an additional polyimide layer and/or a metallic layer applied on the conductor foil, e.g., a tin-coated copper layer. These layers can advantageously produce an abrasion protection effect for the conductor foil at such points where the conductor foil contacts housing parts. During the production of the conductor foil, the tin-coated copper layer, together with the soldering surfaces provided for the connection to the components, can be produced in a simple manner.

It is particularly advantageous to provide the connecting point as a ground for the components connected to the soldering points. For this purpose, provision is made for a further elastically malleable foil segment containing a single grounding printed circuit trace and connecting a soldering surface, soldered to a grounding pin of the component, to the connecting point. In the case of relative movement, arising in response to vibration, between the connecting point, affixed to a housing part, and the soldering points of the components, no force is transmitted by the elastic foil segment to the sensitive soldering points.

It is also advantageous to design the edge of the reinforcing layer, facing the movable part of the feed line segment, with a notched contour, to obtain a smooth transition from the reinforcing area to the elastically malleable area of the feed line segment, and to avoid a break in the printed circuit trace at this location.

DETAILED DESCRIPTION OF THE INVENTION

Figure 1A:
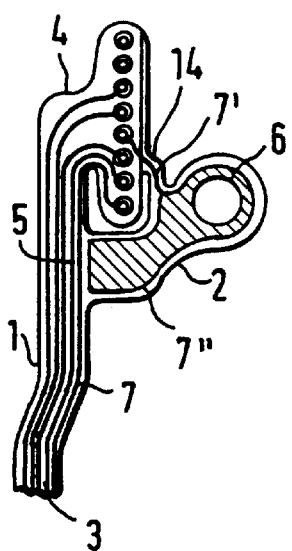
FIG. 1a shows an inner layer of a conductor foil having printed circuit trace patternings.
Figure 1B:
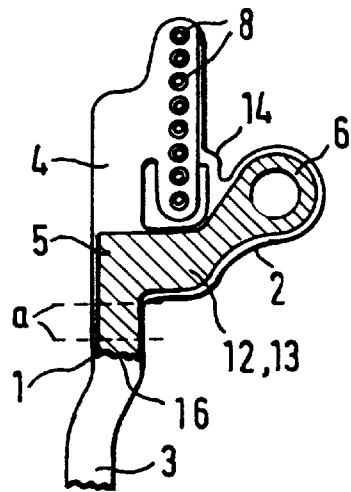
FIG. 1b shows a top view of the conductor foil.
Figure 1C:
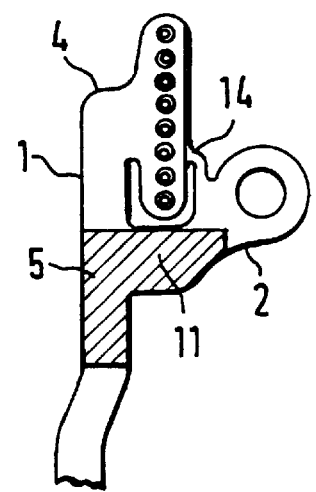
FIG. 1c shows a bottom view of the conductor foil.
Figure 2:
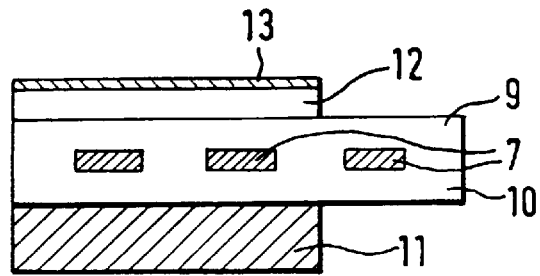
FIG. 2 shows a cross sectional view of a part of the conductor foil.

FIGS. 1a, 1b and 1c show a cut-away portion of a conductor foil having a feed line segment 1. As illustrated in FIG. 1a, the conductor foil has, in a middle layer, thin copper printed circuit traces 7, 7', and 7", which, on the upper and lower sides, are covered by an elastically malleable polyimide layer 9, 10. The layered design of the conductor foil is schematically depicted in FIG. 2. Printed circuit traces 7 of feed line segment 1 are connected to soldering surfaces 8, which are provided for the soldering to the connecting pins of an undepicted electronic circuit carrier. Soldering surfaces 8 are designed in the shape of soldering eyelets. The printed circuit traces can be connected to soldering surfaces 8 on the upper side (FIG. 1b), for example, via metal-coated through holes, in a conventional manner. When the conductor foil is connected to a circuit carrier, e.g., a hybrid circuit, the connecting pins of the hybrid circuit are led through the through holes and are soldered to the soldering eyelets. In response to shaking stress on the arrangement, end 3 of feed line segment 1, which is freely movable, elastically malleable, and connected to the other feed line segments of the conductor foil, oscillates or vibrates. FIGS. 1a, 1b and 1c show a stiffening segment 2 branching off from the feed line segment. Stiffening segment 2 has a large-surface printed circuit trace 7" on the inner layer of the conductor foil (FIG. 1*a*). To large-surface printed circuit trace 7" is connected a further printed circuit trace 7', which is connected to one of soldering surfaces 8 on feed line segment 1, via a narrow elastically malleable foil segment 14. As illustrated in FIG. 1*b* and FIG. 2, provision is made on the upper side of the conductor foil for a copper layer 12, which is covered by a tin layer 13. These metallic layers constitute a reinforcing layer, which increases the rigidity of the conductor foil in the area of stiffening segment 2. Metallic layers 12, 13 extend over entire stiffening segment 2 and over the part of feed line segment 1 which constitutes bonding area 5 of stiffening segment 2. On the reverse side of the conductor foil, as illustrated in FIG. 1*c* and FIG. 2, an additional polyimide layer 11 is applied onto stiffening area 5, the polyimide layer at least partially covering the stiffening area. The polyimide layer also extends over bonding area 5 of feed line segment 1 and stiffening segment 2, and it has a greater thickness than polyimide layer 10. Arranged in stiffening segment 2 is a connecting point 6 shaped as a circular opening. The inner wall of the opening is connected, via a through-plating, to printed circuit trace 7' and printed circuit trace 7". Stiffening segment 2 can be screwed, for example, to a housing part, using a screw passing through this opening. Via printed circuit trace 7', a ground is then simultaneously achieved, both of soldering surface 8, connected to this printed circuit trace, and of the connecting pin of the hybrid circuit, connected thereto. When the arrangement undergoes vibration or shaking stresses, the force of acceleration is now exerted via freely movable end 3 of feed line segment 1 onto reinforcing layers 11, 12, and 13, and is diverted from them to connecting point 6, so that soldering surfaces 8 are relieved of strain and no great stresses are transmitted to them. At the same time, elastic foil segment 14 having the grounding printed circuit trace permits relative movement between connecting point 6 of the stiffening segment and soldering surfaces 8, without diverting force onto the plug connector of the hybrid. Edge 16 of tin-coated copper layer 12, 13 facing end 3 of feed line segment 1 is provided with a notched rim, to prevent a break of printed circuit traces 7 in the transitional area between the flexible conductor foil and the reinforced conductor foil. In the exemplary embodiment shown here, the conductor foil contacts a metallic housing wall in area a. Polyimide layer 11 and metallic layers 12, 13 advantageously generate an abrasion protection effect for the conductor foil.

What is claimed is:

1. A conductor foil for conductively connecting electrical components, comprising:

printed circuit traces insulated on an outer side of the conductor foil and applied on a non-conductive carrier foil, the non-conductive carrier foil being elastically malleable;

at least one feed line segment;

soldering surfaces coupled to the printed circuit traces via the at least one feed line segment for soldering to the electrical components; and at least one stiffening segment extending away from the at least one feed line segment, the at least one stiffening segment adapted for being coupled to a connecting point outside of the electrical components soldered to the soldering surfaces;

wherein shaking stresses generated by vibrations on a movable end of the at least one feed line segment, which is not connected to the soldering surfaces, are diverted away from the soldering surfaces and transmitted to the at least one stiffening segment and to said connecting point.

2. The conductor foil according to claim 1, further comprising:

at least one reinforcing layer partly extending over the at least one stiffening segment and the at least one feed line segment in a common bonding area.

3. The conductor foil according to claim 2, wherein an edge of the at least one reinforcing layer is positioned toward the moveable end.

4. The conductor foil according to claim 2, wherein the at least one reinforcing layer includes at least one of a metallic layer and a non-conductive plastic layer applied onto the conductor foil.

5. The conductor foil according to claim 4, wherein the metallic layer is composed of a copper layer coated with a tin material.

6. The conductor foil according to claim 4, wherein the non-conductive plastic layer is composed of a polyimide material.

7. The conductor foil according to claim 1, wherein the connecting point provides a ground connection for the electrical components.

8. The conductor foil according to claim 1, wherein at least one of the soldering surfaces is coupled to the connecting point via a foil segment, the foil segment including one of the printed circuit traces coupled to the at least one feed line segment.

9. The conductor foil according to claim 8, wherein at least one of the soldering surfaces is coupled to a ground connection of the electrical components, and wherein the printed circuit traces include a grounding printed circuit trace coupled to one of the soldering surfaces.

* * * * *